United States Patent
Bortolami et al.

(10) Patent No.: US 10,982,959 B2
(45) Date of Patent: Apr. 20, 2021

(54) FUSED SENSOR ENSEMBLE FOR NAVIGATION AND CALIBRATION PROCESS THEREFOR

(71) Applicant: The Charles Stark Draper Laboratory, Inc., Cambridge, MA (US)

(72) Inventors: Simone B. Bortolami, Belmont, MA (US); Blaise Morton, Minnetonka, MN (US); Juha-Pekka J. Laine, Boston, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 390 days.

(21) Appl. No.: 15/696,931

(22) Filed: Sep. 6, 2017

(65) Prior Publication Data

US 2018/0066943 A1 Mar. 8, 2018

Related U.S. Application Data

(60) Provisional application No. 62/383,941, filed on Sep. 6, 2016.

(51) Int. Cl.
| | | |
|---|---|---|
| *G01C 21/28* | (2006.01) | |
| *G01C 21/16* | (2006.01) | |
| *G01C 25/00* | (2006.01) | |
| *H03H 17/02* | (2006.01) | |
| *G01C 21/18* | (2006.01) | |
| *G06F 17/18* | (2006.01) | |

(52) U.S. Cl.
CPC ............ *G01C 21/18* (2013.01); *G01C 25/00* (2013.01); *G01C 25/005* (2013.01); *G06F 17/18* (2013.01); *G01C 21/16* (2013.01); *H03H 17/0257* (2013.01)

(58) Field of Classification Search
CPC ........ G01C 21/18; G01C 21/16; G01C 25/00; H03H 17/0257; G06F 17/18
USPC .......................................................... 701/500
See application file for complete search history.

(56) References Cited

U.S. PATENT DOCUMENTS

| | | | |
|---|---|---|---|
| 6,968,281 B2 | 11/2005 | Hanse | |
| 8,649,999 B1 * | 2/2014 | Sheng | ..................... G01P 21/00 702/104 |

(Continued)

FOREIGN PATENT DOCUMENTS

CN 103344257 10/2013

OTHER PUBLICATIONS

Chipworks, "Apple iPhone 6s Complementary Teardown Report with Additional Commentary," 68 pages, Oct. 2015.

(Continued)

*Primary Examiner* — Khoi H Tran
*Assistant Examiner* — Rodney P King
(74) *Attorney, Agent, or Firm* — Sunstein LLP

(57) ABSTRACT

An ensemble of motion sensors is tested under known conditions to automatically ascertain instrument biases, which are modeled as autoregressive-moving-average (ARMA) processes in order to construct a Kalman filter. The calibration includes motion profiles, temperature profiles and vibration profiles that are operationally significant, i.e., designed by means of covariance analysis or other means to maximize, or at least improve, the observability of the calibration model's structure and coefficients relevant to the prospective application of each sensor.

9 Claims, 4 Drawing Sheets

(56) References Cited

U.S. PATENT DOCUMENTS

| | | | |
|---|---|---|---|
| 2004/0211238 A1* | 10/2004 | Hanse | G01C 25/005 73/1.38 |
| 2006/0017610 A1* | 1/2006 | Komjathy et al. | G01S 5/14 342/357.02 |
| 2007/0032951 A1 | 2/2007 | Tanenhaus et al. | |
| 2013/0317741 A1 | 11/2013 | Brashear et al. | |
| 2014/0136088 A1* | 5/2014 | Nikovski | G08G 1/01 701/117 |
| 2017/0122770 A1* | 5/2017 | Steinhardt | G01C 21/165 |

OTHER PUBLICATIONS

Georgiou, et al., "A Convex Optimization Approach to ARMA Modeling," IEEE Transactions on Automatic Control, vol. 53, No. 5, 12 pages, Jun. 2008.

IEEE Aerospace and Electronic Systems Society, "IEEE Standard Specification Format Guide and Test Procedure for Single-Axis Interferometric Fiber Optic Gyros," IEEE STD 952™-1997(R2008), 83 pages, 1998.

Jiang, et al., "Signal Processing of MEMS Gyroscope Arrays to Improve Accuracy Using a $1^{st}$ Order Markov for Rate Signal Modeling," Sensors, vol. 12, pp. 1720-1737, 2012.

Karanasos, "The Correlation Structure of Some Financial Time Series Models," Quantitative and Qualitative Analysis in Social Sciences, vol. 1, Issue 2, pp. 71-87, 2007.

Nassar, "Improving the Inertial Navigation System (INS) Error Model for INS and INS/DGPS Applications," Department of Geomatics Engineering, 178 pages, Nov. 2003.

Nassar, et al., "INS and INS/GPS Accuracy Improvement Using Autoregressive (AR) Modeling of INS Sensor Errors," ION NTM, pp. 936-944, Jan. 2004.

Neusser, "Time Series Analysis in Economics," Ch. 5, pp. 93-105, May 26, 2015.

NovAtel, "IMU Errors and Their Effects," APN-064, Rev. A, 6 pages, Feb. 21, 2014.

Pagemill Partners, "Next-Generation User Interface Technologies for Mobile and Consumer Devices," 71 pages, Mar. 2014.

Petkov, et al., "Stochastic Modeling of MEMS Inertial Sensors," Cybernetics and Information Technologies, vol. 10, No. 2, 10 pages, 2010.

Stoica, et al., "Spectral Analysis of Signals," Prentice Hall, Ch. 3, pp. 103-108, 2005.

Israel Patent Office, ISA, International Search Report and Written Opinion, International Application No. PCT/US2017/050275, 14 pages, dated Jan. 11, 2018.

* cited by examiner

FUSED SENSOR ENSEMBLE FOR NAVIGATION AND CALIBRATION PROCESS THEREFOR

CROSS REFERENCE TO RELATED APPLICATIONS

This application claims the benefit of U.S. Provisional Patent Application No. 62/383,941, filed Sep. 6, 2016, titled "Fused Sensor Ensemble for Navigation and Calibration Process Therefor," the entire contents of which are hereby incorporated by reference herein, for all purposes.

TECHNICAL FIELD

The present invention relates to navigation systems and, more particularly, to navigation systems that input measurements from a plurality of sensors and use navigation filters to synthesize a location reading from the sensor measurements.

BACKGROUND ART

GPS-denied environments impair performance of guided munitions or similar systems, which need GPS accuracy within missions of ten to twenty minutes. Achieving navigation grade performance in small packages and hostile environments typical of MEMS sensors would be seminal. In fact, ongoing research and efforts are paced to deliver such sensors in a five to ten year timeframe, or so. However, in the interim, no suitable solution is available.

SUMMARY OF EMBODIMENTS

An embodiment of the present invention provides a method for calibrating a plurality of motion sensors for an inertial navigation system. Each motion sensor of the plurality of motion sensors has a respective sensor axis. The method includes disposing the plurality of motion sensors on a rate table in a temperature-controlled chamber. The plurality of motion sensors is oriented such that all sensor axes are aligned with an axis of rotation of the rate table. Temperature within the chamber is varied among a plurality of temperatures, and rotation rate of the rate table is varied among a plurality of rotation rates, thereby producing a plurality of combinations of temperature and rotation rate.

For each combination of temperature and rotation rate of the plurality of combinations of temperature and rotation rate, a plurality of time spaced-apart readings from each motion sensor of the plurality of motion sensors is recorded, thereby producing a plurality of readings for each motion sensor. For each motion sensor of the plurality of motion sensors, the plurality of readings is used to automatically estimate a plurality of stochastic models for overall error of the motion sensor. For each motion sensor of the plurality of motion sensors, the overall error is automatically decomposed into autoregressive moving average sub-processes.

Using the plurality of stochastic models and the plurality of readings, for each motion sensor/temperature/rotation rate combination, a Kalman filter is built. The Kalman filter identifies bias and random walk states as a function of time.

Integrated errors for a plurality of sensor-fusion approaches are compared. The plurality of sensor-fusion approaches includes: (a) a weighted average of the plurality of readings, where motion sensors with lower estimated state covariances are given higher weight, (b) a simple average of the plurality of readings and (c) a compensated output of the Kalman filter. The sensor-fusion approach having the lowest error is automatically selected, from among the plurality of sensor-fusion approaches.

Optionally, parameters of the autoregressive moving average sub-processes for bias instability, angular random walk and rate random walk may be automatically estimated.

Another embodiment of the present invention provides a navigation system. The navigation system includes a plurality of sensors. Each sensor provides an output signal. The navigation system also includes a navigation filter coupled to the plurality of sensors. The navigation filter is configured to provide a location of the plurality of sensors, based on the signals provided by the plurality of signals.

The plurality of sensors may include a plurality of MEMS sensors.

The plurality of sensors may further include a plurality of sensors other than MEMS sensors, such as, for example, one or more pressure sensors, one or more temperature sensors, one or more humidity sensors, one or more magnetometers, one or more altimeters and/or one or more inclinometers.

The plurality of sensors may further include at least one accelerometer.

The plurality of sensors may further include at least one gyro.

The navigation system may also include a substrate. The plurality of MEMS sensors may be packaged together on the substrate to prevent mutual lockup, by means of vibration transmission, of any two MEMS sensors of the plurality of MEMS sensors.

Each MEMS sensor of the plurality of MEMS sensors may be driven at a different frequency.

The navigation may be configured such that biases of the plurality of sensors are modelled as autoregressive-moving-average (ARMA) processes.

BRIEF DESCRIPTION OF THE DRAWINGS

The invention will be more fully understood by referring to the following Detailed Description of Specific Embodiments in conjunction with the Drawings, of which.

DETAILED DESCRIPTION OF SPECIFIC EMBODIMENTS

Figure 1:
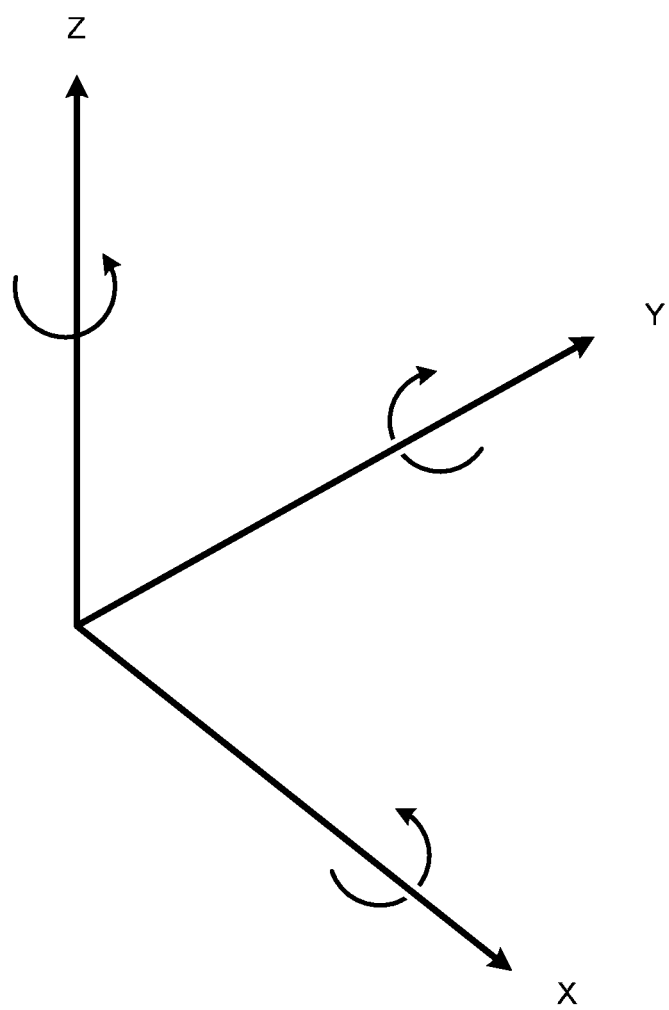
FIG. 1 is a schematic diagram of three orthogonal axes, about and along which a conventional inertial navigation system measures acceleration and rotation, according to the prior art.

An inertial navigation system (INS) uses outputs from sensors that measure acceleration and/or rotation, together with initial information about position, velocity and attitude, to calculate a navigation solution with each new measurement from the sensors. Typically, the sensors include three orthogonally-oriented accelerometers and three orthogonally-oriented gyroscopes (gyros). Accelerometers and gyros are collectively referred to herein as "motion sensors." The accelerometers and gyros provide acceleration and rotation (angular rate) information, respectively, along and about three mutually-orthogonal axes, as shown schematically in FIG. 1.

Sensors are, however, subject to errors. For example, if one accelerometer is perfectly aligned up and down, the accelerometer would measure gravity. If a second accelerometer that is intended to be orthogonal to the first accelerometer were, instead, slightly misaligned, the second accelerometer would undesirably include gravity in its signal. Sensors are also subject to bias, such as due to manufacturing imperfections. A given sensor's output signal represents the sensor's measurement, offset by the bias. Bias has two components (repeatability and stability) that describe the behavior of the bias over time.

Each time a sensor is powered on, the sensor's initial bias is different. This type of bias is referred to as "turn-on bias." Some gyros and accelerometers are subject to change in their biases, depending on how the sensors experience acceleration. This occurs, for example, in microelectromechanical systems (MEMS) sensors when their proof masses undergo acceleration along their sensing axes.

Using multiple sensors of equal nature to sense the same physical variable(s) and compound their outputs by means of signal processing to average their errors has been entertained at different extents many times in the literature with the purpose of achieving higher-tier performance by means of compounding lower-tier sensors. One particular application is with MEMS sensors used to ultimately output location or attitude information, such as of guided munitions.

Embodiments of the present invention may include many types of sensors including, but not limited to, MEMS sensors. However, exemplary embodiments are presented, without lack of generality, for MEMS sensors. Advantages of using such embodiments include enabling the making of tactical-grade instruments, e.g. instruments with low effective error/drift specification, such as a 1 deg./hr. gyro, or even navigation-grade instruments, e.g. a 0.1 deg./hr. gyro, that fit within physical volumes typical of MEMS instruments. We enumerate our novel contributions as follows.

Figure 2:
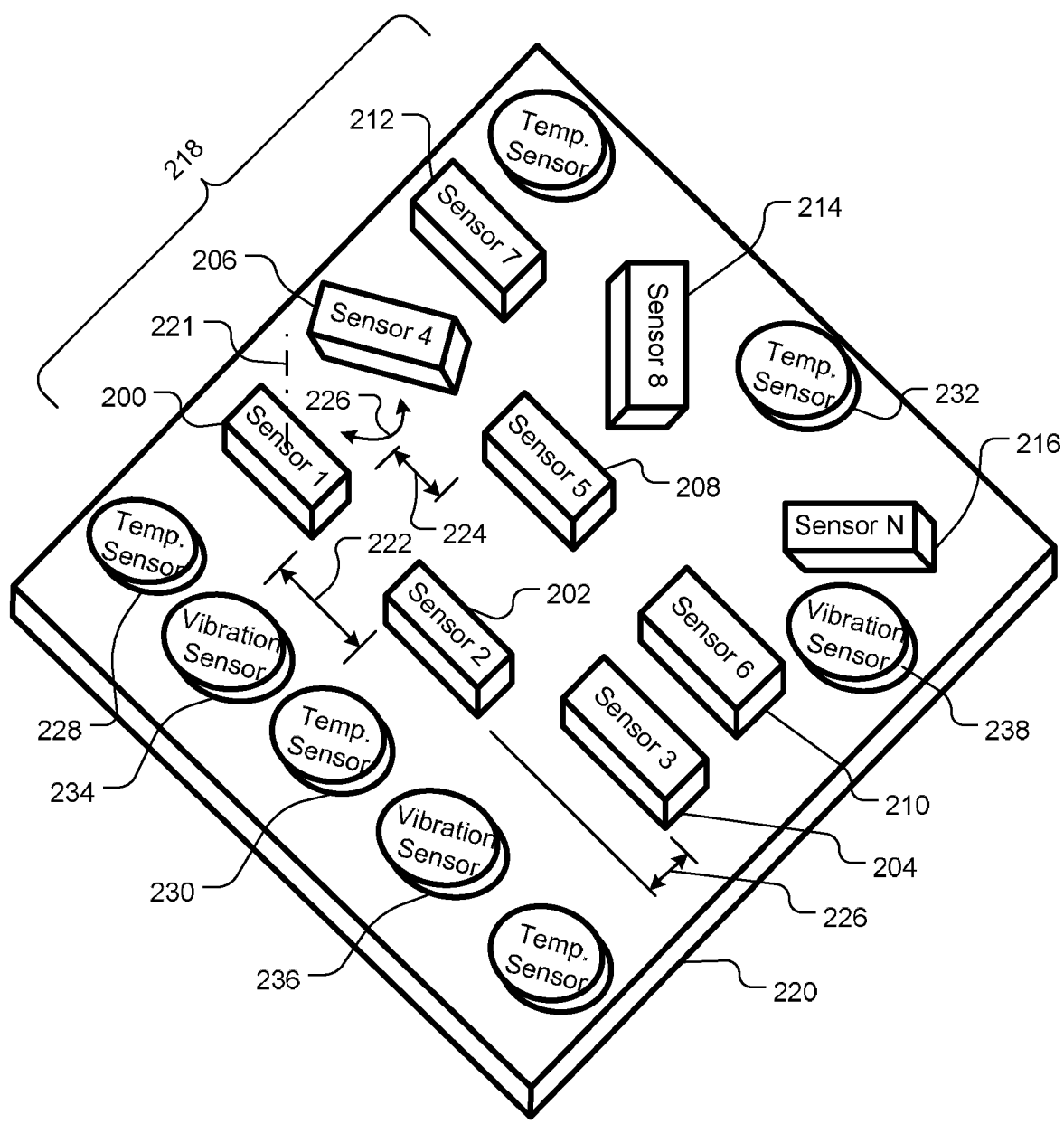
FIG. 2 is a schematic diagram of a substrate, on which are mounted several motion sensors and other sensors, according to an embodiment of the present invention.

As shown schematically in FIG. 2, we use N (greater than one, and in some embodiments greater than three) MEMS and/or other types of sensors, exemplified by sensors 200, 202, 204, 206, 208, 210, 212, 214 and 216 and collectively dubbed an "ensemble" 218, attached to a substrate 220. For simplicity of explanation, only z-axis 221 sensors are shown in FIG. 2. However, x-axis sensors and y-axis sensors (not shown) may also be attached to the substrate 220.

We physically package the sensors 200-216 together on the substrate 220 so as to prevent or reduce mutual lockup of the sensors 200-216 by means of vibration transmission. For example, although the sensors 200-216 may be arranged generally in a regular pattern, i.e., at regular intervals 222 on the substrate 220, some of the sensors, such as sensor 5 (208), may be spaced 224 differently from the regular interval 222. Similarly, sensor 3 (204) is spaced 226 such that it is not in line with the other sensors 200 and 202 in its row. Some or all of the sensors 200-216 may be oriented differently from other of the sensors 200-216. For example, sensor 4 (206) is attached at an angle 226, relative to sensor 1 (200). Similarly, sensor 8 (214) and sensor N (216) are oriented differently from other of the sensors 200-216.

Because of these different spacings and different orientations, vibrations transmitted by the substrate 220 to the various sensors 200-216 affect the sensors differently, such as with different amplitudes and/or phases of the vibrations. Also to prevent or reduce mutual lockup of the sensors 200-216, we may drive the sensors 200-216 at different individual frequencies.

The package may contain temperature sensors, exemplified by temperature sensors 228, 230 and 232, for temperature compensation and vibration sensors, such as accelerometers, exemplified by vibration sensors 234, 236 and 238, in addition to gyros for vibration compensation. The temperature sensors 228-232 and the vibration sensors 234-238 should be distributed about the substrate 220 in order to detect local temperatures and vibrations.

Figure 3:
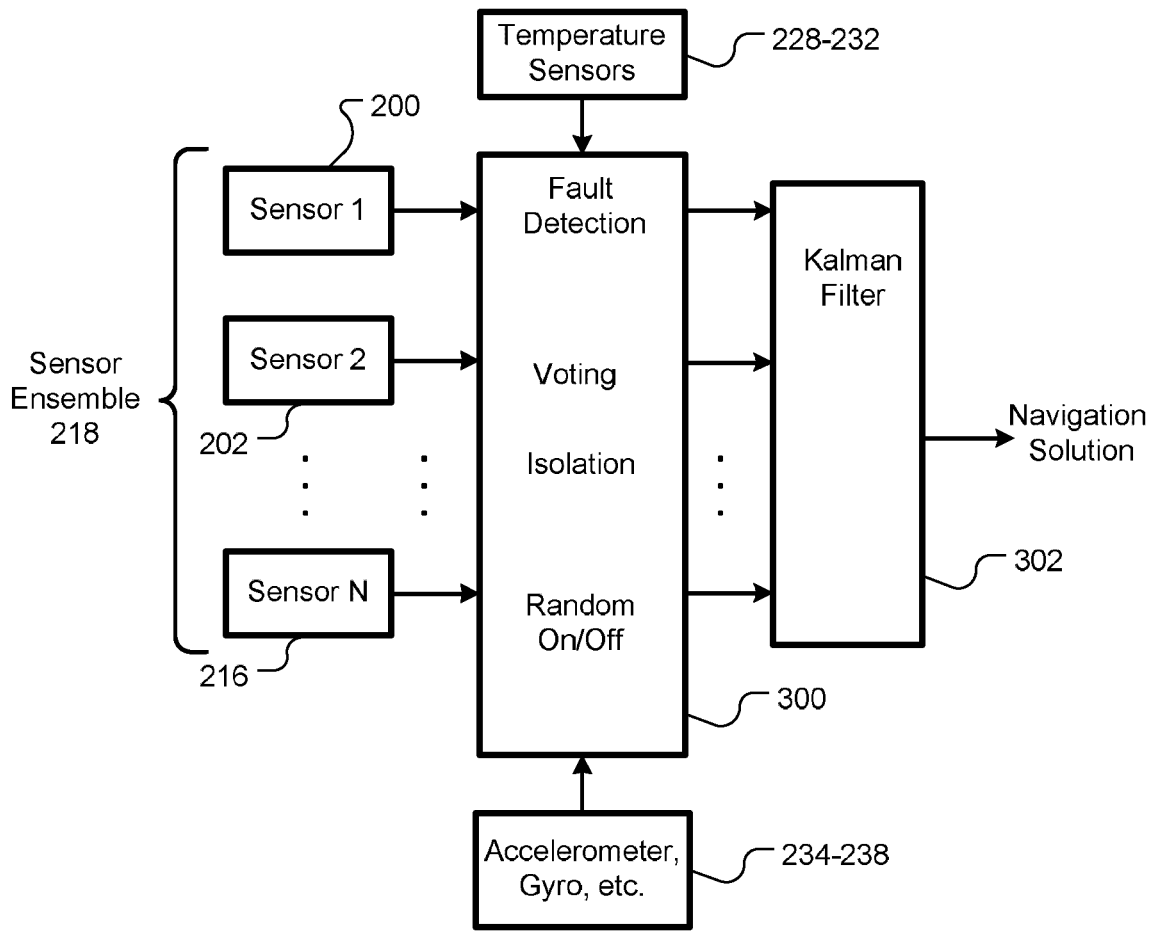
FIG. 3 is a schematic block diagram of a circuit for fusing signals from several motion sensors with a Kalman filter, according to an embodiment of the present invention.

As noted, sensors are subject to turn-on bias. As shown schematically in FIG. 3, an electronic circuit 300 randomizes the order in which the sensors 200-216 are powered on to whiten the effect of individual turn-on biases on the bias of the ensemble 218. Signals from the temperature sensors 228-232, and signals from the vibration sensors 234-238, are used by the circuit 300 to compensate for temperatures, temperature variations, vibrations and variations in vibrations among the sensors 200-216, i.e., across the substrate 220. The circuit 300 also performs fault detection, voting, and isolation of the sensors 200-216. A Kalman filter 302 fuses the N sensor outputs together to generate a navigation solution.

The individual instrument biases are modelled as autoregressive-moving-average (ARMA) processes in order to construct the Kalman filter 302. The ensemble 218 is calibrated by means of a procedure aimed at identifying the structure of the individual sensors' error models to be used in the Kalman filter 302. An example of such a procedure is described herein. The calibration includes motion profiles, temperature profiles, and vibration profiles that are operationally significant, i.e., designed by means of covariance analysis or other means to maximize, or at least improve, the observability of the calibration model's structure and coefficients relevant to the prospective application of the sensor. Individual sensors 200-216 may be packaged with different up/down, clockwise/counter-clockwise etc. orientations to yield a virtual symmetry of properties by ensemble.

Review of the literature, to the best of our knowledge, has shown that: (a) Practitioners who experimented with multiple-aligned gyros calibrated only at static conditions (i.e., no angular rate) and tested only at fixed temperature conditions and did not try using higher-order ARMA models for their Kalman filter designs, as we do. (b) The only reference found used higher-order ARMA stochastic processes in the Kalman filter(s), but without a moving average part. (c) The same reference used wavelet de-noising to find the model's coefficients, while we use, but are not limited to, a one-state discrete lag to reduce the white noise in the raw output and then apply Georgiou's convex optimization approach to get coefficients for the higher-order ARMA models. (d) Additionally, Georgiou, who with Lindquist created the ARMA modeling tool we use, did not consider MEMS sensors, or any real-world systems, in his paper.

GPS-denied environments impair performance of guided munitions or similar systems, which need GPS accuracy within missions of ten to twenty minutes. Achieving navigation grade performance in small packages and hostile environments typical of MEMS sensors would be seminal. In fact, ongoing research and efforts are paced to deliver such sensors in about a five to ten year time frame. In the interim, embodiments of the present invention, referred to herein as "FUSE," could deliver such performance, even though not necessarily fully optimized in size, power, and cost, by using ensembles of commercially available sensors and special testing and signal processing, as described herein. Application of FUSE also extends to unmanned aerial vehicles (UAVs), autonomous underwater vehicles (AUVs), and commercial application such as, but not limited to, cell phones, wearable devices, etc.

The following example of our approach is general enough to improve on all the limitations of previous studies. Specifically, we include:
  a) model coefficients for temperature variation;
  b) model coefficients for dynamic angular rate input;
  c) an ability to use first-order Gauss Markov, AR(2), AR(3) and more general ARMA models; and
  d) an innovative analytical method for identifying stochastic processes for the errors of each individual sensor.

Calibration Approach

The calibration approach applies generally to arbitrary functions of states. In the example here, we choose simple functions of temperature and angular rate, but functions of other states may be used.

We consider a system that includes N (greater than one, and in some embodiments greater than three) single-axis gyros, aligned as well as practical along the Z-axis, each gyro having a scale factor (SFi), a bias ($\beta$i), and two other calibration processes Ai and Bi. The calibration equation for the ith gyro is:

$$V_i = A_i T + \beta_i + (SF_i + B_i T)\omega + s_i \varepsilon_i \quad (1)$$

where $V_i$ is the voltage (or other signal) output of the $i^{th}$ sensor, T is the measured temperature (a known value, same for all sensors), $\omega$ is the true value of the angular rate about the Z-axis, $s_i$ is the standard deviation of the residual noise term, and $\varepsilon_i$ is a zero-mean unit variance Gaussian normal random variable.

First, for this example, we describe a calibration scheme, next a calibration algorithm.

Calibration Scheme

Figure 4:
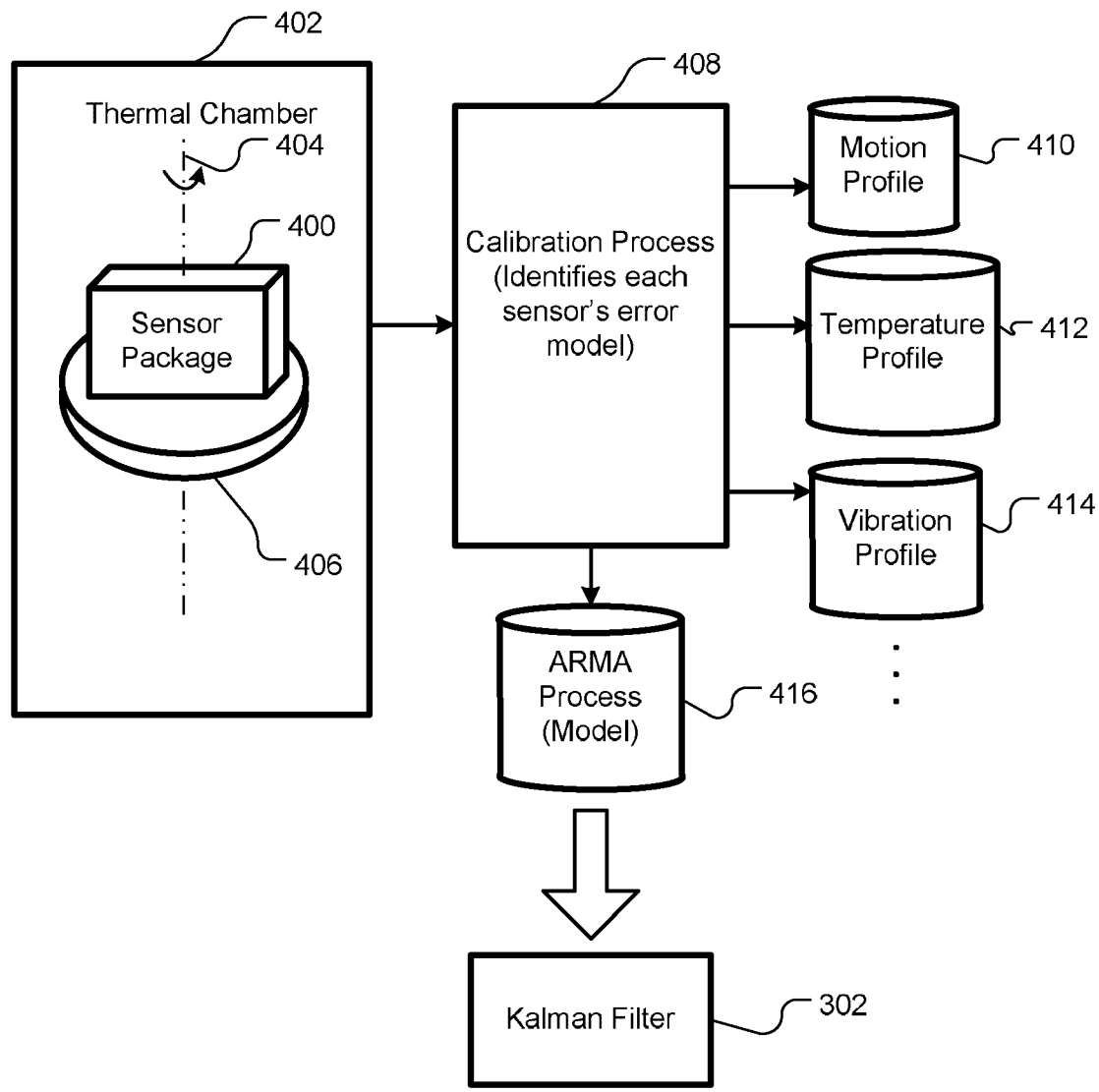
FIG. 4 is a schematic diagram of an apparatus and process for calibrating a set of motion sensors and generating the Kalman filter of FIG. 3, according to an embodiment of the present invention.

As schematically illustrated in FIG. 4, all the sensors 200-216 should be installed in a package 400 as they would be configured in a vertical gyro (VG) system. The package 400 should then be placed on end in a temperature-controlled thermal chamber 402, with the z-axis of the sensors 200-216 aligned (parallel) with the rotational axis 404 of a horizontal rate table 406. For a specified grid G={($\omega_j$, $T_k$)|j=1, . . . , J, k=1, . . . , K} the angular rate and temperature are set in the chamber 402, and, after the environment has stabilized, the voltages $V_{ijk}$ are recorded. This set G is called the set of test conditions. A calibration process 408 automatically identifies each sensor's error model and generates a motion profile 410, a temperature profile 412 and a vibration profile 414 for the sensors 200-216. In some embodiments, the calibration process 408 generates additional or other profiles (not shown). The calibration process 408 automatically generates an ARMA process (model) 416, from which the Kalman filter 302 (FIG. 3) may be generated.

One illustrative approach is J=5 and K=4, thereby giving twenty different combinations of angular rate and temperature.

Calibration Algorithm

For sensor i we have J*K values of raw data series, one series for each test condition, for the output voltages $V_{ijk}$ in equation (1) above.

For each {i, j, k} we analyze the residual:

error time series=observed time series−time average.

The ultimate goal, in this example, is to find the coefficients of stochastic processes for the errors in the parameters $A_i$, $\beta_i$, $SF_i$, and $B_i$ in the model equations (1) above. We begin (in stage 1) by finding stochastic models for the overall error of each sensor, then we look (in stage 2) for ways to decompose the overall error into sub-processes associated with each parameter. The general class of stochastic process considered is autoregressive moving average (ARMA), of which Gaussian Markov (GM) processes are a special case. For each different type of stochastic model we select, there will be a stage 1 and a stage 2, as described below. The calibration algorithm is motivated by the real-world problem, as described in the references [Nasser1] and [Petkov 2010].

Key steps for the initial stage 1:
  1) In the calibration scheme, raw digital output data for each sensor is acquired at a high sample rate (50 to 100 Hz) for, a time period that would yield statistically valid data, such as about 8 hours, at each point in the ($\omega_1$, $T_k$) grid G.
  2) From each sensor time series, we use Allan variance and power spectral density (PSD) charts to find parameters of stochastic processes for bias instability, angular random walk (ARW) and rate random walk (RRW) according to [IEEE Std 952-1997]. The result is a Gauss-Markov process for bias instability, white noise for ARW, and a random walk for RRW. The form of an AR(1) model (covering both Gauss-Markov and random walk) is:

$$X_t = -\varphi_1 X_{t-1} + Z_t \quad (2)$$

where $X_t$ is the time-t output, $Z_t$ is a Gaussian independent and identically distributed (IID) process with variance $\sigma^2_z$, and $\varphi_1$ is a constant value such that $|\varphi_1| \leq 1$ (note: a random walk is the special case $\varphi_1 = -1$).
  3) Using these stochastic models, for each {i, j, k} we build a Kalman filter to identify the bias and random walk states from the recorded noisy sensor output values as a function of time. Then we compensate the output signal by subtracting our estimates of those states from the sensor output. The compensated rate signals may then be integrated over time and compared with the uncompensated integrated signals to see how much benefit the filtering provides to each sensor in terms of angular error as a function of time.
  4) For each test condition ($\omega_j$, $T_k$) in G, we then consider the following three VG, sensor-fusion approaches (we exclude sensors with obvious problems): (a) combine the compensated outputs from each sensor signal into a weighted-average output, where sensors with lower estimated state covariances are given higher weight, (b) combine the uncompensated sensor outputs into a simple average output and (c) generate the compensated output for all the sensors using a Kalman filter having far fewer states. Compare the integrated errors for the three different sensor-fusion approaches.

While performing these analyses, we look at how the model parameters compare for different test conditions. The ultimate goal is to decompose the error processes into a sum of sub-processes according to the equations in (1) above. For the simple AR(1) and noise models at the initial stage, there is no opportunity to do much, other than to estimate white-noise coefficients that depend on ($\omega_j$, $T_k$). Because the white-noise processes are relatively large, there is some benefit to estimating the white noise coefficients, so the stage 2 for the initial step is:

5) Estimate, for each of the different test cases, white-noise coefficients for each of the parameters $A_i$, $\beta_i$, $SF_i$, and $B_i$. The result of this modeling task is to transfer some of the noise associated with $\varepsilon i$ into white-noise processes depending on $(\omega_j, T_k)$ via the model parameters. One possible result would be that the simple stochastic models used in initial stage 1 depend in a complicated way on the states, suggesting that higher-order models are needed (see the next stage 1). It is important to quantify the dependence of the noise processes on the test conditions, because the ultimate performance of the VG might be reduced if we cannot compensate for it. When this task is complete, we assess to what extent state-dependence of the processes might impact ultimate performance of the VG.

6) It is also useful to assess the level of cross-correlation of the errors for different pairs of sensors $i_1$, $i_2$ in each test condition j, k. This task is complicated by the large white noise at each sensor output. See the procedure described in step 9 below. The same analysis should be applied here in the initial stage 2.

The next step is to use higher-order ARMA processes as stochastic models. This step is natural mathematically, because the various noise processes (white noise, GM, random walk) used in the usual stochastic gyro models, when added together, generically become higher-order ARMA processes. For example, the sum of two AR(1) processes is an ARMA(2,1) process.

One practical benefit of using higher-order ARMA processes is to increase accuracy of the estimates of the bias-drift and RRW states from the Kalman filter used, as in step (3) above. In the reference [Nasser1], the performance of their Kalman filter improved when AR(2) models were used in place of AR(1) (same as Gauss-Markov). So we test for the AR(2) models in place of each of the AR(1) bias-drift and RRW models used in the initial stage 1.

The question is: how should we pick the coefficients in the new AR(2) models. There are many possible approaches. Some embodiments of the present invention use the following relatively simple approach in stage 1 for all different combinations of higher-order ARMA models. The steps are:

7) First assume the outputs of the bias drift model and the RRW model (see equation 2 in step 2 above) are now AR(2) models. The form of such models is:

$$Y_t = -\theta_1 Y_{t-1} - \theta_2 Y_{t-2} + W_t \quad (3)$$

where $Y_t$ is the output at time t, $\theta_1$ and $\theta_2$ are real constants and $W_t$ is an IID Gaussian mean-zero process. The three parameters we need to identify now are $\theta_1$, $\theta_2$ and $\sigma^2_W$=variance of the process $W_t$. There is an analytic formula for $\sigma^2_Y$ as a function of $\theta_1$, $\theta_2$ and $\sigma^2_W$. The only constraint based on the information from step 2 above is that these parameters be chosen so that:

$$\sigma_Y^2 = \sigma_X^2 = \sigma_Z^2/(1+\varphi_1^2) \quad (4)$$

This equation follows because we are trying to create a new process Y that has the same variance as X. There are more conditions needed to determine all three parameters. Our approach is described in the next step.

8) There are standard methods for fitting the coefficients of an AR(2) model to a sample of time-series data, but in fact we are looking at a sum of AR(2) with another AR(1) or AR(2), which in either case is a more general ARMA process, so we need to use a method suitable for fitting general ARMA processes here.

Unfortunately, standard techniques (e.g. Gaussian Maximum Likelihood estimator, see discussion in section 5.3 of [Neusser]) used to estimate ARMA models for economic time series are cumbersome when applied to the estimation of bias drift and RRW in gyros. One problem with the standard techniques arises because the high level of white noise at the sensor output, relative to the dynamics we are trying to estimate (bias drift and RRW processes). Economic time series do not have such a low signal-to-noise ratio, and the numbers of data points used in the computations are in the tens or hundreds, not millions. In fact, the AR(2) models obtained in [Nasser1] were obtained only after the raw sensor output had been de-noised by a wavelet-transform procedure.

Another problem with the standard techniques in that, though they are iterative, they still require very large memories for problems of our size, and they do not have guaranteed convergence criteria (see discussion on page 103 of [Stoica 2005]). Instead of the standard maximum likelihood estimation (MLE) approach, we adopt an efficient method presented in [Georgiou 2008].

Wavelet de-noising might be a good technique if the goal is simply to see what might be under the noise, but it produces an output that is acausal and not an ARMA process. Wavelet filtering is acausal. In our approach, we reduce the white noise by filtering the raw sensor output in a way that produces ARMA models from models that are ARMA+large white noise. Because of this, we can use ARMA model estimation on the result.

We perform the following steps in this example:

a) Filter the raw sensor output through a 1-state (low pass) filter (in the form of an AR(1) model). This maps ARMA+large white noise into an ARMA model of slightly higher degree.

b) Estimate the low-frequency discrete spectral density function (SDF) of the sensor error by computing the discrete Fourier transform of the estimated autocovariance of the filtered data.

c) Find an ARMA process model of the desired degree whose weighted, discrete SDF matches most closely the discrete SDF of the weighted data. In this example, to fit the SDF to an ARMA process of fixed order (e.g. ARMA(5,4)), we use the convex optimization approach to ARMA presented in [Georgiou 2008].

9) The autocovariance sequences $H_{ijk}(\tau)$ ($\tau$ takes discrete values) of the weighted output is computed for sensor i at each gridpoint j, k. Cross correlations of different weighted sensor processes (for different values of i, same values of j, k) are also computed to check for independence. Independence is assumed later, if found to be plausible. Large benefits from sensor-fusion problem are probably not achievable, unless the pairwise correlations of output errors for different values of i are sufficiently small, for example, below about 0.05.

10) From the discrete SDFs of $H_{ijk}(\tau)$ for a fixed i and different j, k we get different ARMA models. Call them $M^i_{jk}$. Each $M^i_{jk}$ is represented by a few parameters. For example, assume the AR part includes five parameters and the MA part includes four parameters. Based on each $M^i_{jk}$, we build a Kalman filter and repeat the analyses performed in steps 3 and 4 using these new filters.

By fitting a fixed form of ARMA model, for example ARMA(5,4) to a MEMS gyro in 20 or more states (each state represented by different combinations of environment values T and rate), we can examine the state dependence of the ARMA model and see if an accurate state-dependent calibration (writing the parameters as functions of the state) can be found.

The accuracy of the calibration can be tested by building a state-dependent Kalman filter and testing the errors of the filtered rate measurements as the sensor is moved to other states outside the calibration set. It might be necessary to adjust the form of the ARMA model to see if a better fit can be found.

By comparing the results of the ARMA-compensated versus basic AR(1)-model compensated versus uncompensated sensor outputs we can quantify the relative benefits of using different calibration models and various sensor fusion methods.

11) Once we have an accurate, calibrated higher-order ARMA model, we see if it is possible to find four different (in this example) first-order Gauss-Markov models for $A_i$, $\beta_i$, $SF_i$, and $B_i$ that, when multiplied by appropriate functions $(\omega_j, T_k)$ and then added together and filtered, approximate the model $M^i_{jk}$. If four such models are found, the goal of identifying stochastic processes for the parameters $A_i$, $\beta_i$, $SF_i$, and $B_i$ has been met. Otherwise, a different model (either for equation (1) or for the choice of ARMA model) is necessary. This process is summarized in a flowchart in FIG. 4.

The need for multiple hours of data is driven by the fact that the stochastic-process parameters to be estimated in steps 2, 8 and 10 above are hidden in a relatively larger ambient white noise. So there is a need to average over very many observations. On page 28 of [Nasser2], the autocorrelation sequences for accelerometers and gyros from a Litton 90-100 IMU, a Honeywell HG1700 and an AHRS400CC-100 (this last one uses MEMS technology for both accelerometers and gyros, see page 27 for discussion of all three) are graphed. Those graphs were computed from 8 hours of static data+wavelet de-noising in each case.

The baseline approach to the computations in step 11 above relies on assuming, for this example, the four processes $A_i$, $\beta_i$, $SF_i$, and $B_i$ are not affected by the choice of $(\omega_j)$.

A comparison of autocorrelation functions for different types of AR processes is shown in Chapter 2 of [Nasser2], starting on page 18. One discrepancy found between first-order GM and the autocorrelations of real gyros is the increase in the ACS values of real gyros for $|\tau|$ above a certain time lag. Other AR processes are identified that have ACS features similar to real gyros.

Once the AR models for the coefficient processes and the noise parameters are identified for each of the sensors, a Kalman filter for producing an estimate for the VG model parameter errors can be built. One method for integrating all the gyros into a single VG Kalman filter is shown in [Jiang 2012] for a first-order GM model applied to six gyros.

In contrast to the method of [Jiang 2012], using an order p>1 AR model for all four parameters increases the state transition matrix in the Kalman filter by $4*(p-1)$ dimensions per sensor (see equation 3.21 on page 48 of [Nasser2]). For an N-gyro VG, the dimension increases by $4*N*(p-1)$.

In [Nasser 1] it is shown that the results for AR(2) are noticeably better than those for AR(1) (same as GM), and that AR(3) doesn't improve things much more than AR(2). For example, in [Nasser 1] pp. 942, the statistics of inertial navigation unit (INU) stand-alone position errors in static testing using first-order GM and various-order AR noise models are compared for a single-sensor error filter applied to LTN 90-100 IMU (gyro drift 0.01 deg./hr.) and Honeywell HG1700 (gyro drift 1.0-10 deg./hr.).

REFERENCES

[Ai6s] Chipworks, "Apple iPhone 6s A1688 Smartphone Chipworks Teardown Report BPT-1509-801," 2015.
[NGU] Pagemill Partners, "Next-Generation User Interface Technologies for Mobile and Consumer Devices, March 2016.
[IEEE Std 952-1997] IEEE Standard Specification Format Guide and Test Procedure for Single-Axis Interferometric Fiber Optic Gyros, IEEE Aerospace and Electronic Systems Society, 1998.
[Jiang 2012] Jiang, Chengyu et al., "Signal Processing of MEMS Gyroscope Arrays to Improve Accuracy Using a 1st Order Markov for Rate Signal Modeling," Sensors 2012, 12, 1720-1737.
[Karanasos 2007] Karanasos, M., "The Correlation Structure of Some Financial Time Series Models," Quantitative and Qualitative Analysis in Social Sciences, Volume 1, Issue 2, 2007, pp. 71-87.
[Nasser1] Nasser, S. et al., "INS and INS/GPS Accuracy Improvement Using Autoregressive (AR) Modeling of INS Sensor Errors," ION NTM 2004, 26-28 Jan. 2004, San Diego, Calif.
[Nasser2] Nasser, S., "Improving the Inertial Navigation System (INS) Error Model for INS and INS/DGPS Applications," UCGE Reports Number 20183, November 2003.
[Petkov 2010] Petkov, Petko, "Stochastic Modeling of MEMS Inertial Sensors," Cybernetics and Information Technologies, Volume 10, No. 2, 2010.
[Georgiou 2008] Georgiou and Lindquist, "A convex optimization approach to ARMA modeling," IEEE Transactions on Automatic Control, Vol 53, Issue 5, June 2008 pp. 1108-1119.
[Neusser] Neusser, Klaus, "Time Series in Economics," Online PDF.
[Stoica 2005] Stoica, P. and R. Moses, Spectral Analysis of Signals, Prentice Hall, 2005.

While the invention is described through the above-described exemplary embodiments, modifications to, and variations of, the illustrated embodiments may be made without departing from the inventive concepts disclosed herein. For example, although specific parameter values, such as dimensions and materials, may be recited in relation to disclosed embodiments, within the scope of the invention, the values of all parameters may vary over wide ranges to suit different applications. Unless otherwise indicated in context, or would be understood by one of ordinary skill in the art, terms such as "about" mean within ±20%.

As used herein, including in the claims, the term "and/or," used in connection with a list of items, means one or more of the items in the list, i.e., at least one of the items in the list, but not necessarily all the items in the list. As used herein, including in the claims, the term "or," used in connection with a list of items, means one or more of the items in the list, i.e., at least one of the items in the list, but not necessarily all the items in the list. "Or" does not mean "exclusive or."

Although aspects of embodiments may be described with reference to flowcharts and/or block diagrams, functions, operations, decisions, etc. of all or a portion of each block, or a combination of blocks, may be combined, separated into separate operations or performed in other orders. References to a "module" are for convenience and not intended to limit its implementation. All or a portion of each block, module or combination thereof may be implemented as computer program instructions (such as software), hardware (such as combinatorial logic, Application Specific Integrated Circuits (ASICs), Field-Programmable Gate Arrays (FPGAs), processor or other hardware), firmware or combinations thereof.

Embodiments, or portions thereof, may be implemented by one or more processors executing, or controlled by, instructions stored in a memory. Each processor may be a general purpose processor, such as a central processing unit (CPU), a graphic processing unit (GPU), digital signal processor (DSP), a special purpose processor, etc., as appropriate, or combination thereof.

The memory may be random access memory (RAM), read-only memory (ROM), flash memory or any other memory, or combination thereof, suitable for storing control software or other instructions and data. Instructions defining the functions of the present invention may be delivered to a processor in many forms, including, but not limited to, information permanently stored on tangible non-writable storage media (e.g., read-only memory devices within a computer, such as ROM, or devices readable by a computer I/O attachment, such as CD-ROM or DVD disks), information alterably stored on tangible writable storage media (e.g., floppy disks, removable flash memory and hard drives) or information conveyed to a computer through a communication medium, including wired or wireless computer networks. Moreover, while embodiments may be described in connection with various illustrative data structures, systems may be embodied using a variety of data structures.

Disclosed aspects, or portions thereof, may be combined in ways not listed above and/or not explicitly claimed. In addition, embodiments disclosed herein may be suitably practiced, absent any element that is not specifically disclosed herein. Accordingly, the invention should not be viewed as being limited to the disclosed embodiments.

What is claimed is:

1. A method for calibrating a plurality of motion sensors for an inertial navigation system, each motion sensor of the plurality of motion sensors having a respective sensor axis, the method comprising:
    disposing the plurality of motion sensors on a rate table in a temperature-controlled chamber;
    orienting the plurality of motion sensors such that all sensor axes are aligned with an axis of rotation of the rate table;
    varying temperature within the chamber among a plurality of temperatures, and varying rotation rate of the rate table among a plurality of rotation rates, thereby producing a plurality of combinations of temperature and rotation rate;
    recording, for each combination of temperature and rotation rate of the plurality of combinations of temperature and rotation rate, a plurality of time spaced-apart readings from each motion sensor of the plurality of motion sensors, thereby producing a plurality of readings for each motion sensor;
    for each motion sensor of the plurality of motion sensors, using the plurality of readings to automatically estimate a plurality of stochastic models for overall error of the motion sensor;
    for each motion sensor of the plurality of motion sensors, automatically decomposing the overall error into autoregressive moving average sub-processes;
    using the plurality of stochastic models and the plurality of readings, for each motion sensor/temperature/rotation rate combination, building a Kalman filter that identifies bias and random walk states as a function of time;
    comparing integrated errors for a plurality of sensor-fusion approaches, wherein the plurality of sensor-fusion approaches comprises: (a) a weighted average of the plurality of readings, where motion sensors with lower estimated state covariances are given higher weight, (b) a simple average of the plurality of readings and (c) a compensated output of the Kalman filter; and
    automatically selecting a sensor-fusion approach having a lowest error from among the plurality of sensor-fusion approaches.

2. A method according to claim 1, further comprising automatically estimating parameters of the autoregressive moving average sub-processes for bias instability, angular random walk and rate random walk.

3. A navigation system, comprising:
    a plurality of sensors, each providing an output signal; and
    a Kalman filter constructed using biases of the plurality of sensors modeled as autoregressive-moving-average (ARMA) processes, such that structure of each sensor's error model is identified for use in the Kalman filter, the Kalman filter being coupled to the plurality of sensors and configured to provide a location of the plurality of sensors, based on the signals provided by the plurality of signals.

4. A navigation system according to claim 3, wherein the plurality of sensors comprises a plurality of MEMS sensors.

5. A navigation system according to claim 4, wherein the plurality of sensors further comprises a plurality of sensors other than MEMS sensors.

6. A navigation system according to claim 4, wherein the plurality of sensors further comprises at least one accelerometer.

7. A navigation system according to claim 4, wherein the plurality of sensors further comprises at least one gyro.

8. A navigation system according to claim 4, further comprising a substrate, and wherein the plurality of MEMS sensors is packaged together on the substrate to prevent mutual lockup, by means of vibration transmission, of any two MEMS sensors of the plurality of MEMS sensors.

9. A navigation system according to claim 4, wherein each MEMS sensor of the plurality of MEMS sensors is driven at a different frequency.

* * * * *